United States Patent [19]

Actor et al.

[11] Patent Number: 5,478,455
[45] Date of Patent: Dec. 26, 1995

[54] METHOD FOR CONTROLLING A COLLIMATED SPUTTERING SOURCE

[75] Inventors: Geri M. Actor, Monte Sereno; Stephen M. Higa, San Jose; Vance E. Hoffman, Jr., Los Altos; Patrick O. Miller, Mountain View; Pamela R. Patterson, Palo Alto, all of Calif.

[73] Assignee: Varian Associates, Inc., Palo Alto, Calif.

[21] Appl. No.: 123,759

[22] Filed: Sep. 17, 1993

[51] Int. Cl.⁶ ............................................. C23C 14/54
[52] U.S. Cl. .................... 204/192.13; 204/298.03; 204/298.11
[58] Field of Search ................... 204/192.13, 298.03, 204/298.11, 298.25

[56] References Cited

U.S. PATENT DOCUMENTS

| | | | |
|---|---|---|---|
| 4,166,783 | 9/1979 | Turner | 204/192.13 |
| 5,126,028 | 6/1992 | Hurwitt et al. | 204/192.13 |
| 5,186,594 | 2/1993 | Toshima et al. | 204/298.25 |
| 5,223,108 | 6/1993 | Hurwitt | 204/298.11 |

FOREIGN PATENT DOCUMENTS

| | | | |
|---|---|---|---|
| 0440377 | 8/1991 | European Pat. Off. | 204/298.11 |

*Primary Examiner*—R. Bruce Breneman
*Assistant Examiner*—Rodney G. McDonald
*Attorney, Agent, or Firm*—Marilyn E. Glaubensklee

[57] ABSTRACT

A method for automatically controlling a collimated sputtering source that is controllable by a computer to compensate for the build-up of sputtered material on the collimator. The method involves providing software for the computer including a formula to calculate a multiplier as a function of the age of the collimator, sequentially depositing film on a series of substrates using the sputtering source, monitoring the age of the collimator, and using the software to periodically adjust the value of a controllable sputtering parameter as a function of the multiplier. The sputtering parameter is automatically adjusted by the software such that a property of the film deposited by the source on the series of substrates does not substantially vary among the substrates as sputtered material builds up on the collimator.

28 Claims, 2 Drawing Sheets

1

METHOD FOR CONTROLLING A COLLIMATED SPUTTERING SOURCE

FIELD OF THE INVENTION

The present invention relates to the physical vapor deposition of thin films and more particularly to automatically controlling a collimated sputtering source such that the thickness of film deposited by the source does not vary as sputtered material builds up on the collimator. The invention is particularly useful in providing for continuous, automatic compensation for the build up of sputtered material on a collimator used during semiconductor device fabrication.

BACKGROUND OF THE INVENTION

Deposition of thin films of various materials on a substrate or wafer is one of the primary processes used in the fabrication and processing of microelectronic devices, such as integrated circuit chips. Successful film deposition generally requires control of various characteristics of the deposited films. For example, films having a predetermined uniform thickness commonly are required. Uniformity of film thickness over the surface of a wafer and from one wafer to another are similarly important. In many applications it is also important for the film to sufficiently fill vias or holes in the substrate. Finally, the deposited films must meet demanding specifications for such factors as resistivity, grain size, etc. For many years, the trend in semiconductor device fabrication has been toward ever increasing device density and the use of ever larger wafer substrates. The result of this trend has been increasingly demanding requirements for deposited films. Commercial fabrication of electronic devices having features in the sub-micron range on eight-inch wafers is now commonplace in the industry.

One of the most commonly used film deposition techniques is sputtering within a vacuum chamber using a magnetron sputtering source. In a conventional magnetron sputtering source, a low-pressure plasma consisting of positive ions from a support gas, such as argon, bombards the surface of a cathode made of a target material to be sputtered. The impact of the ions dislodges particles from the target cathode. The sputtered particles leave the target in a variety of directions and may be further scattered due to collisions with gas ions or molecules or with each other. Some of the sputtered particles are directed toward the substrate and attach to the surface of the substrate, forming a coating or film. In conventional sputtering, the deposited film is of the same material or alloy of materials as the sputter target. In reactive sputtering, a reactive gas is introduced into the vacuum chamber to form a film comprising a compound of the target material and the reactive material. For example, in a process that is becoming increasingly important in semiconductor device manufacture, material sputtered from a titanium target reacts with nitrogen which is introduced at low pressure into the sputtering chamber to form a titanium nitride film.

In sputtering sources used for semiconductor device fabrication, a spatial filter or "collimator," comprising a plurality of transmissive cells, may be positioned between the sputtering target and the substrate to prevent sputtered particles from reaching the substrate surface at low angles of incidence, (i.e., low angles between the trajectories of the particles and the surface of the substrate). Low angle sputtered material is undesirable in that it does not contribute to film growth at the bottom of holes or vias. Such particles are often deposited on the sides, near the tops of vias, thereby pinching off the amount of sputtered material that can enter the hole or via as deposition progresses. This leads to voiding within the via resulting in unacceptably poor electrical contact between layers on the substrate.

A discussion of a sputtering apparatus employing a collimating filter and of the use of collimation may be found in allowed U.S. patent application Ser. No. 07/780,882, now U.S. Pat. No. 5,330,628 coassigned herewith, the disclosure of which is incorporated by reference. Use of a collimator imparts directionality to the flux of sputtered particles reaching the surface of the substrate, thereby allowing the sputtered particles to reach the bottom of holes or vias without getting pinched off by growth on the sidewalls of the vias. Film deposited in hole and via openings grows at a rate closer to the rate of film growth on the wafer surface. As via diameters and device features have shrunk, the need for collimation when performing sputtering has increased. Applicant has shown that use of a collimator makes it is possible to fill vias less than one half micron in diameter, thereby extending the use of sputtering for via filling to at least the next generation of high density integrated circuits.

When a collimator is used, however, much of the sputtered material is deposited on the surfaces of the collimator cells. In some cases, as much as eighty percent of the sputtered material is deposited on the cell surfaces. As material is deposited on the cell walls, the cross-sectional area of the cell opening is correspondingly reduced. Even if particles are sputtered from the target cathode at a constant rate, the build-up of sputtered material on the cell walls reduces the rate at which sputtered material can pass through the collimator, thereby slowing the effective deposition rate. As the cell openings are reduced in size, the rate of build up on the collimator increases. This variation in deposition rate due to "clogging" of the collimator can lead to undesirable variations in film thickness among substrates that have undergone sputtering from the same sputtering source under otherwise equal conditions.

In most sputtering systems, the rate of deposition decreases over the life of the sputter target, further complicating the ability to obtain a film of desired uniform thickness on a wafer during a particular "run" of the system. Many prior art patents show the use of various types of deposition rate sensors which are used to monitor and adjust the deposition rate from a sputtering source so that a film of a desired thickness may be obtained. However, deposition rate sensors are expensive and unreliable and, thus, have not gained widespread commercial acceptance. In U.S. Pat. No. 4,166,783, coassigned herewith, a simple approach to compensating for the decrease in sputtering rate due to erosion of an annular target, was described and claimed. The approach of the '783 patent is to maintain a constant deposition rate by monitoring the age of the sputter target, measuring the voltage and current supplied to the plasma to determine the power dissipated in the plasma, and adjusting the plasma power according to empirically obtained information stored in a computer look-up table.

The only known prior art technique for compensating for the build up of sputtered material on a collimator used in a sputtering system involves periodically measuring the film thickness after sputtering onto a wafer to determine the effective film deposition rate, and increasing the sputtering deposition time appropriately to maintain the films reasonably close to the desired thickness. This method of maintaining uniform film thickness has many limitations. For example, it requires continuous manual intervention to effect control of sputtered film thickness, which manual intervention is time and labor intensive. Also, film thickness is subject to human error of measurement and correction. Additionally, film thickness may vary between the periodic measurements and adjustments of the sputtering source. It is noted that in semiconductor processing, as a practical matter, film deposition must be done in a single step without breaking vacuum. It is not feasible to later add to the thickness of a film which is determined to be too thin after the substrate has been removed from the sputtering system.

Accordingly, there is a need for a method for depositing a film having a uniform, predetermined thickness on a substrate using a collimated sputtering source that continuously and automatically adjusts for the build up of sputtered material on the collimator.

One object of the present invention is, therefore, to provide a method for automatically controlling a collimated sputtering source such that the thickness of film deposited by the source does not vary as sputtered material builds up on the collimator.

Another object of the present invention is to reduce the amount of manual intervention required to maintain and adjust a collimated sputtering source during deposition of thin films.

Still another object of the present invention is to reduce the variability in sputtered film thickness among a series of sputter-coated substrates by automatically compensating for the build up sputtered material on the collimator and for erosion of the target.

A further object of the present invention is to reduce the costs of production and operation related to sputtering during semiconductor device fabrication.

These and other objects of the present invention will become clear to those skilled in the art from the following detailed description, the accompanying drawings and the appended claims.

SUMMARY OF THE INVENTION

Broadly stated, the present invention is a method for using a computer means to control a sputtering source having a collimator and one or more controllable sputtering parameters such that a property of the films deposited by the source on a series of substrates does not vary among the substrates due to the build up of sputtered material on the collimator, said method comprising the steps of providing software for the computer means which includes a formula for calculating a multiplier which is a function of the age of the collimator, sequentially depositing a film through said collimator on a series of substrates, monitoring the age of the collimator, and using said software to periodically automatically adjust the value of a computer controllable sputtering parameter as a function of said multiplier. In one preferred embodiment, the formula used to define the multiplier is an $n^{th}$ order polynomial equation where n is equal to or greater than three. In another preferred embodiment the formula used is an analytical equation in the form $AF=Y_o/(Y_o-m_T X)$, where AF is the multiplier, $Y_o$ is the deposition rate when the collimator is new, $m_T$ is the slope of the curve of deposition rate versus target age at time T, and x is the age of the collimator. The sputtering parameters that may be varied in accordance with the method of the present invention include the deposition power and the deposition time, or both. In addition, the software may be written to further include a formula for compensating for changes in deposition rate associated with aging of the sputter target, or different formulas may be used each time a collimator is replaced depending on the age of the sputter target.

DETAILED DESCRIPTION OF THE INVENTION

The present invention is a method for automatically controlling a collimated sputtering source such that a property of film being deposited by the source remains at a predetermined value irrespective of the build up of sputtered material on the collimator. Typically, the property that is being maintained constant over time is the thickness of the deposited layer. The invention may be implemented using a conventional sputtering source, such as a planar magnetron sputtering source, having a computer means that automatically adjusts one or more of the sputtering parameters used by the source to compensate for the decrease in deposition rate caused by the build up of sputtered material on the collimator. In a further refinement of the present method the sputtering parameter may also be controlled to compensate for changes in the deposition rate due to erosion of the sputter target. In this manner, sputtered films may be deposited at constant film thickness on a series of wafers or substrates over the life of the collimator.

Figure 1:
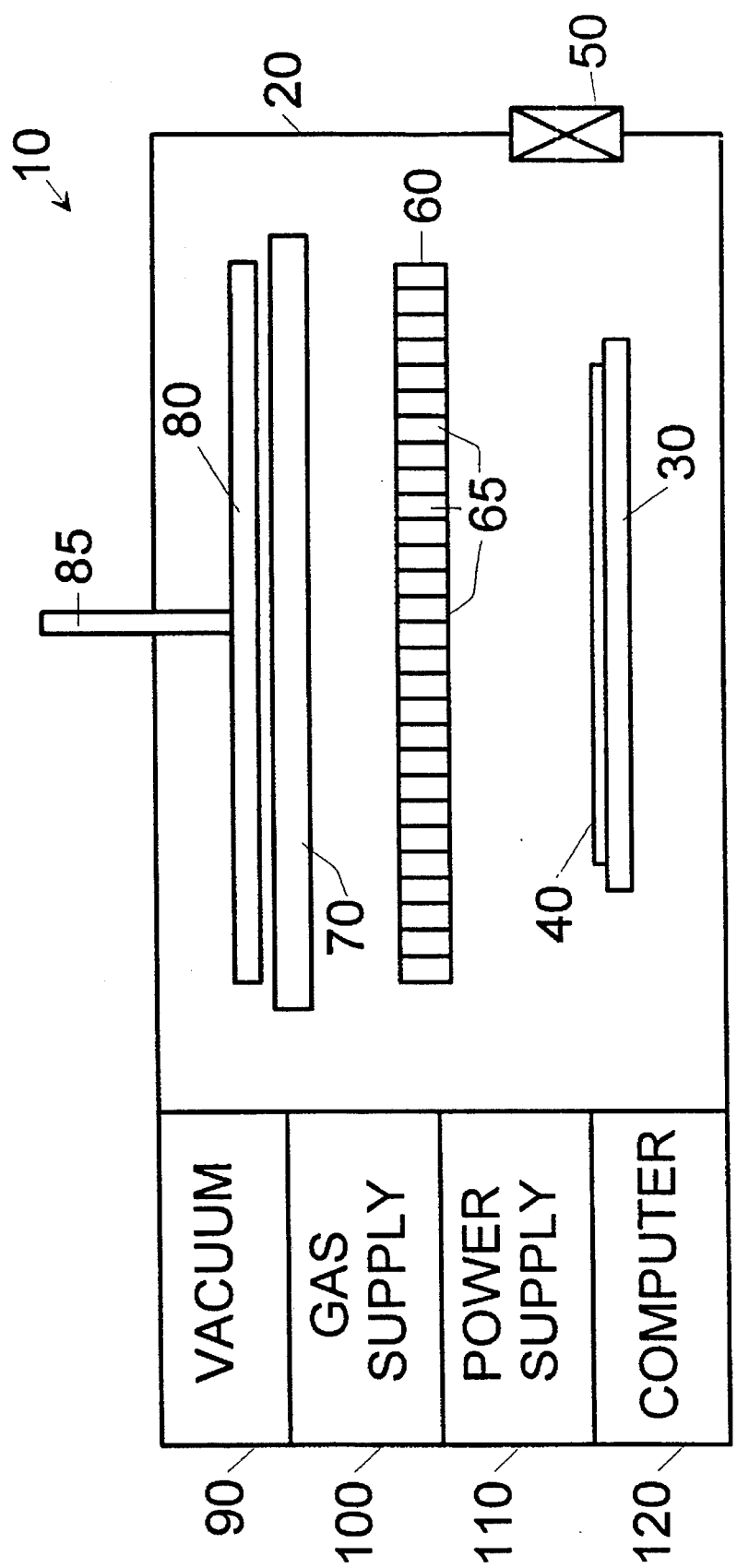
FIG. 1 is a schematic diagram of sputtering system used in the practice of the present invention.

An exemplary sputtering system which may be used in the practice of the present invention is schematically depicted in FIG. 1 to which we now turn. Overall sputtering system 10 comprises a vacuum enclosure 20, a wafer platform 30 upon which a wafer 40 is positioned, and a gas tight door 50 through which wafers are inserted onto and removed from wafer platform 30 by a transfer means, such as a robotic arm (not shown). Sputtering system 10 further comprises a collimation filter 60 having a plurality of individual transmissive cells 65, a sputter target 70 which also serves as the system cathode, and a rotating magnet assembly 80 which is rotated by shaft 85. Various additional components, well-known to those skilled in the art, such as shutters, dark-space shields, wafer retaining means, wafer temperature control means, mounting structures, sensors, etc., are also included within vacuum enclosure 20 but are not shown for simplicity since they are not important to an understanding of the present invention. FIG. 1 shows wafer 40 in a horizontal position, with the active surface, i.e., the surface upon which material is sputtered, facing up, and sputter target 70, also horizontal, positioned above the wafer facing down. Those skilled in the art will recognize that other orientations of these components are possible; for example, wafer 40 can be held vertically, or horizontally above the sputter target, facing down.

In communication with vacuum chamber 20 are a vacuum subsystem 90, a gas supply subsystem 100, a power supply subsystem 110 and a computer means 120. The computer means includes software capable of implementing the method of the present invention, as described below, and of controlling the various hardware subsystems. Sputtering source 10 may be a single module in a multi-module wafer processing system such as the system sold by the assignee of the present invention under the trademark M-2000™. In such a case, various ones of the subsystems shown may be used in connection with more than one module; for example, a single computer means may be used to control all of the various process chambers.

In practice, wafer 40 is introduced into chamber 20 through door 50 and positioned on wafer platform 30. Door 50 is then sealed and vacuum system 90 is used to pump down chamber 20 to a desired high vacuum level, for example, $10^{-8}$ Torr. As is well known, vacuum system 90 comprises a roughing pump and a high vacuum pump (such as a cryopump), as well as pressure monitoring means, all of which are operatively coupled to computer means 120. When a suitable vacuum level is attained, a plasma support gas, such as argon, is introduced under computer control into the vacuum chamber from gas supply system 100. Gas supply system 100 may also be used to supply a reactive gas into chamber 20 in the event reactive sputtering is to be performed. Typically, the pressure within chamber 20 is raised to about 1–5 milliTorr to conduct sputtering. When using a collimator, it is especially important to maintain a low pressure within chamber 20 so that particles passing through the collimator will not be scattered after exiting the collimator.

Sputter target 70 comprises a surface facing the wafer, in contact with the plasma, made of a material to be sputtered, such as aluminum or titanium. As described above, energetic positive ions from the plasma bombard the negatively charged target surface dislodging atoms. These ejected atoms travel in various directions through the vacuum enclosure, and some of them eventually reach the surface of wafer 40 where they form a film. Plasma is confined to a region adjacent to the surface of the sputter target by a magnetic field, created by rotating magnet assembly 80, which loops through the surface of the target to create a closed-loop magnetic tunnel. When performing collimated sputtering, it is very important that the erosion rate (i.e., the emission rate), is uniform across the face of the sputter target. While sputter target 70 is shown as having a planar surface, other shapes may be utilized. A suitable sputtering source for practicing the present invention which provides highly uniform erosion across the face of the target is described in detail in allowed U.S. patent application Ser. No. 07/919,074, now U.S. Pat. No. 5,252,194 coassigned herewith, the disclosure of which is incorporated by reference. As shown in FIG. 1, in the preferred embodiment, sputter target 70 has a greater diameter than wafer 40. For example, a suitable commercially available sputtering source available from the assignee of the present invention is designed to treat eight-inch wafers and has a planar sputter target diameter in excess of eleven inches.

A collimator 60 is positioned between sputter target 70 and wafer 40. Collimator 60 acts as a spatial filter, intercepting particles having trajectories which are low in respect to the surface of wafer 40. In this manner, only sputtered atoms which are travelling in directions predominantly normal to the surface of the wafer are allowed to pass. Collimator 60 comprises a plurality of transmissive filter cells 65. In a collimated sputtering source commercially available from the assignee of the present invention, filter cells 65 are hexagonal in shape to form a honeycomb pattern, and have a cross-sectional dimension of approximately one centimeter. The aspect ratio of filter cells 65, i.e., the ratio of cell length to average diameter, is preferably in the range of approximately 0.75:1 to 4:1. As shown, collimator 60 is larger in diameter than wafer 40, such that particles emitted from the target 70 cannot reach wafer 40 without passing through collimator 60.

Computer means 120 is used to control all aspects of the operation of the sputtering system, and has the ability to automatically adjust the various sputtering parameters, as required, in accordance with a process "recipe" which is maintained in computer memory or which is entered by the system operator. Computer means 120 implements recipes, or otherwise controls the sputtering source, by adjusting the value of various sputtering parameters. The primary parameters that influence the thickness of the film deposited on a wafer are deposition power and deposition time. Deposition power is defined as the input power provided by the sputtering system power supply to energize the plasma during sputtering. In sputtering system 10, power supply 110 can be used to vary the power coupled to the plasma over a range and is controllable by computer means 120. Deposition time is defined as the time period during which sputter deposition onto a single wafer or substrate occurs.

In accordance with the present invention, computer means 120 is used to control sputtering source 10 by periodically adjusting the value of a selected sputtering parameter during deposition of a film on a series of wafers. The adjustments are performed in accordance with a predetermined compensation formula contained in software for computer means 120. In one preferred embodiment of the present invention, the deposition time is increased after the processing of each wafer. In another preferred embodiment the deposition power is increased after the processing of each wafer. The compensation formula may be developed experimentally for each combination of collimator aspect ratio, sputtering material, chamber pressure and other conditions by empirically determining the value of the selected sputtering parameter that is necessary to cause the sputtering source to deposit film at a predetermined thickness as a function of the age of the collimator. The formula may also compensate for changes in the deposition rate due to erosion of the sputter target. The compensation formula may also be developed by using suitable computer modelling techniques rather than by empirical measurement.

The formula used may be expressed in a variety of mathematical formats, such as a polynomial expression or an exact fit analytic expression that defines an adjustment factor as a function of the age of the collimator. In one embodiment, the compensation algorithm comprises an $n^{th}$ order polynomial, where n is equal to or greater than three. In the preferred embodiment, an adjustment factor is calculated and used as a multiplier which is multiplied by the value of the deposition parameter used during sputtering of a substrate to determine the value of the parameter to be used during sputtering of the next substrate in the series. The age of the collimator is determined by the amount of material that has been sputtered through the collimator. In conventional sputtering sources, for a given set of process parameters, the rate at which material is sputtered is related to the power coupled into the plasma. Thus, the age of the collimator may conveniently be expressed in kilowatt hours from the time of installation.

Figure 2:
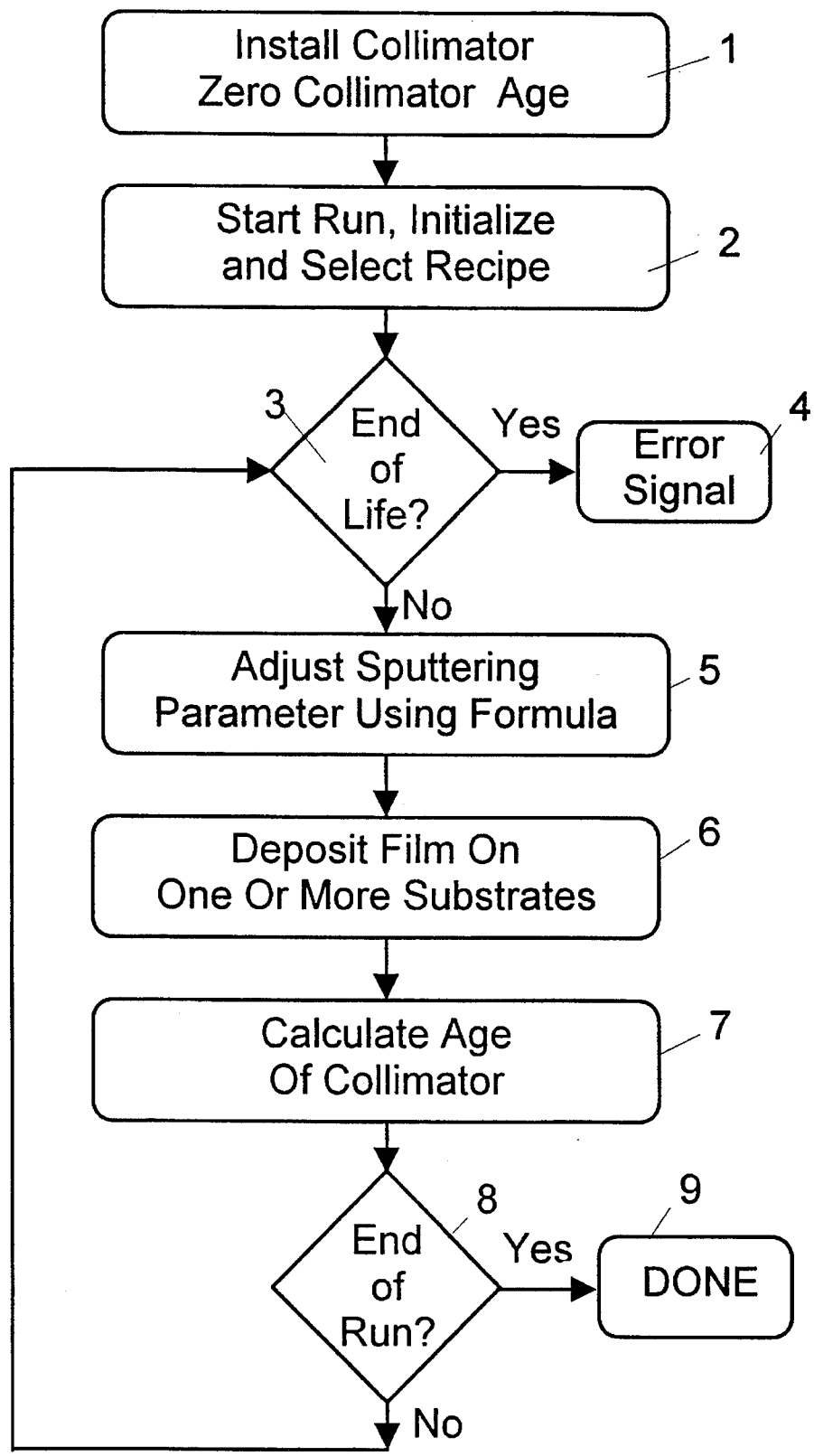
FIG. 2 is a flow chart showing the steps in a method for controlling a sputtering source according to the present invention.

FIG. 2 is a flow chart showing the steps in a method for controlling a sputtering source according to the present invention using computer means to adjust sputtering parameters and control the sputtering source. As illustrated, at step 1 a new collimator, i.e., a collimator with substantially no build up of material, is installed in the sputtering system and the non-volatile computer system memory dedicated to storing the age of the collimator is reset to zero. For purposes of the present invention, a "new" collimator is one which has substantially no film deposited on it. It need not be new in the sense that it was never used before. In particular, it is contemplated that collimators of the type used in connection with the present invention may be cleaned of deposited material after reaching the end of their normal operating lifetime, and then reused.

At step 2, the system is initialized and a "run" of a series of wafers to be processed is begun. A recipe for deposition onto the series of wafers is selected from those available in computer memory, or one is entered into the computer by the system operator. The recipe defines, among other things, the thickness of the film to be deposited. In the preferred embodiment, the sputtering system is automated such that the sputtering parameters used to implement the selected recipe are calculated by the computer means. As will be apparent to those skilled in the art, the method of the present invention will often be started at step 2, since the replacement of a collimator will be a relatively infrequent occurrence.

At step 3, as it does prior to any sputtering run, the system computer checks the collimator age value stored in memory to determine whether the collimator has reached the end of its useful life. Assuming a new collimator was installed at step 1, and the collimator age value reset to zero, the process continues to step 5, where sputtering parameters are adjusted in accordance with the recipe entered. As described above, in accordance with the present invention, the computer means is provided with software which will prescribe sputtering parameters to satisfy the selected recipe and which further includes a formula defining an adjustment factor to adjust one or more of these parameters as a function of the age of the collimator to compensate for the build up of material on the collimator cells.

In one preferred embodiment, the formula used to define the adjustment factor is an $n^{th}$ order polynomial equation, where n is equal to or greater than three. In one such embodiment, n equals five. In another preferred embodiment the formula used is an exact fit analytical equation in the form $AF=Y_o/(Y_o-m_T x)$, where AF is the multiplier, $Y_o$ is the deposition rate when the collimator is new, $m_T$ is the slope of the curve of deposition rate versus target age at time T, and x is the age of the collimator. In either case, the formula which is used may be empirically determined for a particular set of sputtering conditions such as target material, chamber pressure, etc., or may be developed by computer modeling.

At step 6, sputtering commences and film is deposited on N substrates or wafers in accordance with the selected recipe before proceeding to step 7. In the preferred embodiment of the present invention, N equals one, and the age of the collimator is calculated at step 7 after each wafer is processed.

In one embodiment of the present invention, the age of the collimator is monitored by measuring the elapsed time of sputtering and multiplying it by the power of the plasma to arrive at the cumulative number of kilowatt hours of collimator use. Thus, at step 7, the computer calculates the age of the collimator by multiplying the deposition power and the deposition time used during sputtering of the substrate and adding this to the age of the collimator stored in memory prior to the last iteration of step 3. As described above, this calculation may be performed after each wafer, after each cassette of wafers is processed, or at some other periodic interval.

After step 7, the computer determines whether the system has reached the end of the run of wafers (step 8). If the end of run has been reached, the computer signals that the system is done processing wafers (step 9) and awaits further operator input, e.g., commencement of the next run. If the run has not been completed, the process returns to step 3 where the newly calculated age of the collimator is compared to the preprogrammed maximum useful life of the collimator stored in computer memory. If the useful life of the collimator has been exceeded, an error signal 4 will be sent to the operator and sputtering will not proceed. If the useful life of the collimator has not been exceeded, the system proceeds to repeat the process, i.e., the computer calculates a new adjustment factor (step 5), and sputtering commences on the next N substrates to be coated (step 6) using the adjusted sputtering parameter(s). As noted, the process may be performed after each wafer (N=1), or may be performed after each cassette of wafers is processed, or at some other periodic interval. Build up of material on the collimator is a relatively slow process, i.e., the life of a collimator will extend to several thousand wafers, such that the comparison of step 3 need not be performed after each wafer. On the other hand, the procedure of this step is simple enough that comparison after each wafer is processed is easily implemented and is not burdensome.

Adjustment of the sputtering parameter(s) (step 5) may be performed at the same periodic intervals as the calculation of the age of the collimator (step 7), (i.e., after N wafers have been processed) or may be done at a different interval. For example, the age calculation of step 7 may be performed after each wafer while a new adjustment factor is calculated (step 5) only after each cassette of wafers has been processed. This variation of the present invention, which is less preferred, is not shown in the flow chart of FIG. 2 but proceeds with the adjustment of step 5 only after every kN wafers are processed, (where N is the number of wafers processed at step 6 before proceeding to step 7, and k is an integer). Thus, step 5 is only performed once for each k times steps 6, 7 and 3 are performed.

The sequence of steps 3–6 is repeated until all the wafers in the series of wafers have been coated (step 9) or until the useful life of the collimator is exceeded (step 4) or until the sputtering source is otherwise caused to stop the process, as by an operator interrupt. Normally, sputtering is stopped prior to the end of the useful life of the collimator, and the age of the collimator is maintained in permanent (non-volatile) computer memory so that it can be used for implementing the present invention when the next series of wafers is run.

In a further refinement of the present invention, the periodic application of a multiplier in the form of an adjustment factor takes into account not only the aging of the collimator, but also the change in deposition rate accompanying the erosion of the target. Again, a polynomial or exact fit formula is developed using empirical data or computer modelling to arrive at an adjustment factor which takes into account both the age of the collimator and the age of the target.

Replacement of sputter targets and of collimators requires taking the sputtering system out of operation for maintenance, during which time the vacuum is broken. Since most commercial users of sputtering systems desire to have the systems "on-line" as much as possible, normal maintenance procedures for replacement of these items are, preferably, established such that the interval between replacement of one is a multiple of the interval between replacement of the other. For example, a maintenance schedule might be established such that the target is replaced at the time of every other collimator replacement. In another embodiment of the present invention for use with a maintenance schedule of this sort, the sputtering system computer stores multiple formulas for calculating the adjustment factor, one for each interval. Thus, for example, if the target is replaced at the time of every other collimator replacement, (i.e., two collimators are used for each target), one formula would be applied during the first interval, starting when a new target and a new collimator are used, and a second formula applied during the second interval, starting when a new collimator and a half-used target are employed. This approach simplifies the development of appropriate formulas since the formula used during any interval need only take into account a single variable, i.e., collimator age, but will, nonetheless, compensate for target erosion as well.

While the present invention has been particularly described with respect to preferred embodiments, it will be appreciated that various alterations, modifications, and adaptations may be made based on the present disclosure, and are intended to be within the scope of the present invention. While the invention has been described in connection with what is presently considered to be the most practical and preferred embodiments, it is to be understood that the present invention is not limited to the disclosed embodiments but, to the contrary, is intended to cover various modifications and equivalents that are within the scope of the appended claims.

What is claimed is:

1. A method for automatically controlling a sputtering source having a collimator, said sputtering source being controllable by a computer, said method comprising the steps of:

(a) providing software for said computer including a formula to calculate a multiplier, said multiplier being a function of the age of the collimator, said age related to buildup of sputter material on said collimator;

(b) sequentially depositing film comprising a material from a sputter target passed through said collimator on a series of substrates using the sputtering source;

(c) monitoring the age of the collimator;

(d) using said software to automatically periodically adjust the value of a controllable sputtering parameter as a function of said multiplier during step (b), such that a property of the film deposited by the source on said series of substrates does not substantially vary among the substrates as sputtered material builds up on the collimator.

2. The method of claim 1 wherein said formula is in the form of an $n^{th}$ order polynomial.

3. The method of claim 2 wherein n is at least three.

4. The method of claim 2 wherein said polynomial is in the form:

$$AF=1+ax+bx^2+cx^3+dx^4+ex^5,$$

where AF is said multiplier, a, b, c, d and e are coefficients, and x is the age of the collimator.

5. The method of claim 4 wherein the age of the collimator is expressed as the number of kilowatt hours of energy applied to the sputtering source during the life of the collimator.

6. The method of claim 1 wherein said formula is in the form:

$$AF=Y_o/(Y_o-m_T x),$$

where AF is said multiplier, $Y_o$ is the deposition rate when said collimator is new, $m_T$ is the slope of the curve of deposition rate versus target age at time T, and x is the age of the collimator.

7. The method of claim 6 wherein $m_T$ is constant over the life of the collimator.

8. The method of claim 1 further comprising the steps of monitoring the life of the sputter target and using said software to automatically periodically adjust a controllable sputtering parameter as a function of the age of the sputter target.

9. The method of claim 8 wherein the controllable sputtering parameter adjusted as a function of the age of the sputter target is different than the controllable sputtering parameter adjusted in step (d).

10. The method of claim 1 wherein said sputtering parameter is deposition power.

11. The method of claim 1 wherein said sputtering parameter is deposition time.

12. The method of claim 1 wherein said formula determines the value of said sputtering parameter to be used during the deposition of a particular substrate by defining an adjustment factor that is multiplied by the value of the parameter used during sputtering of a substrate in said series of substrates to obtain the value of the parameter to be used during sputtering of the next substrate in said series of substrates.

13. The method of claim 1 wherein an adjustment of said sputtering parameter is made after each substrate in said series of substrates is processed.

14. The method of claim 1 wherein said series of substrates is transferred into said sputtering source from a cassette containing a plurality of substrates, and wherein an adjustment of said sputtering parameter is made after each cassette is processed.

15. The method of claim 1 wherein said formula is empirically determined.

16. The method of claim 1 wherein said collimator is replaced at predetermined subintervals of duration I, and said sputter target is replaced at an intervals of duration Ix, where x is a whole number greater than one, and wherein a different formula is used during each subinterval within interval Ix, such that the system compensates for both aging of the collimator and aging of the sputter target.

17. The method of claim 1 wherein the sputtering source is a planar magnetron sputtering source.

18. The method of claim 1 wherein said property of the film is the thickness of the film.

19. A magnetron sputtering source, comprising:

a vacuum enclosure;

a sputter target situated in said vacuum enclosure;

a wafer platform situated in said vacuum enclosure;

means for generating a plasma adjacent to the surface of said sputter target;

a collimation filter positioned between said sputter target and said wafer platform in said vacuum enclosure;

computer means for controlling the sputtering source to deposit a film comprising a material from said sputter target passed through said collimation filter on to a substrate;

means for monitoring the age of said collimator;

software means for said computer including a formula that automatically periodically adjusts the value of a controllable sputtering parameter as a function of the age of said collimation filter, said age related to buildup of sputter material on said collimation filter, such that a property of the film deposited does not substantially vary among substrates a sputtered material builds up on the collimation filter.

20. A method for automatically controlling a sputtering source comprising a collimator, said sputtering source being controllable by a computer, said method comprising the steps of:

(a) providing software for said computer including an algorithm relating buildup of sputtered material on said collimator to a control parameter of said sputtering source;

(b) sequentially depositing film comprising a material from a sputter target passed through said collimator on a series of substrates using said sputtering source; and (c) using said software to automatically periodically adjust the value of said control parameter, such that a property of said film deposited by said source on said series of substrates does not substantially vary among said substrates as sputtered material builds up on said collimator.

21. A sputtering system for sequentially depositing a film on a series of substrates, comprising:

(a) a collimator;

(b) a sputter target, said film comprising a material from said sputter target being passed through said collimator; and (c) software for monitoring the age of said collimator and for automatically controlling said sputtering system, said software including an algorithm having variables related to buildup of said material on said collimator;

wherein said software automatically periodically adjusts the value of a controllable sputtering parameter, said controllable sputtering parameter being based on said age of said collimator, such that a property of said film deposited on said series of substrates does not substantially vary among said substrates as said material builds up on said collimator.

22. The method of claim 20 wherein said algorithm is in the form of an $n^{th}$ order polynomial.

23. The method of claim 20 wherein said control parameter is an amount of energy applied to said sputtering system during the life of said collimator.

24. The method of claim 20 wherein said control parameter is deposition power.

25. The method of claim 20 wherein said control parameter is deposition time.

26. The method of claim 20 wherein an adjustment of said control parameter is made after each substrate in said series of substrates is processed.

27. The method of claim 20 wherein said algorithm is empirically determined.

28. The method of claim 20 wherein said property of said film is the thickness of said film.

* * * * *